(12) United States Patent
Wu et al.

(10) Patent No.: US 12,317,554 B2
(45) Date of Patent: May 27, 2025

(54) CONTACT STRUCTURES FOR SEMICONDUCTOR DEVICES

(71) Applicant: Taiwan Semiconductor Manufacturing Company, Ltd., Hsinchu (TW)

(72) Inventors: Huei-Shan Wu, Keelung (TW); Yi-Lii Huang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 366 days.

(21) Appl. No.: 17/716,331

(22) Filed: Apr. 8, 2022

(65) Prior Publication Data
US 2022/0328626 A1 Oct. 13, 2022

Related U.S. Application Data

(60) Provisional application No. 63/173,169, filed on Apr. 9, 2021.

(51) Int. Cl.
*H01L 29/86* (2006.01)
*H10D 30/67* (2025.01)
(Continued)

(52) U.S. Cl.
CPC ....... *H10D 62/118* (2025.01); *H10D 30/6713* (2025.01); *H10D 30/6735* (2025.01); *H10D 30/6757* (2025.01); *H10D 84/0128* (2025.01); *H10D 84/013* (2025.01); *H10D 84/038* (2025.01)

(58) Field of Classification Search
CPC ............ H01L 29/41775; H01L 29/401; H01L 29/41733; H01L 29/4236; H01L 29/458; H01L 29/4908
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
(Continued)

FOREIGN PATENT DOCUMENTS

CN 109427677 A * 3/2019 ..... H01L 21/823814

*Primary Examiner* — Jarrett J Stark
(74) *Attorney, Agent, or Firm* — Sterne, Kessler, Goldstein & Fox P.L.L.C.

(57) ABSTRACT

The present disclosure describes semiconductor devices and methods for forming the same. A method for forming a semiconductor device includes forming a source/drain structure and forming a gate structure. The method also includes performing a cleaning process on the source/drain structure and the gate structure. The method also includes disposing a portion of a byproduct of the cleaning process on a top surface of the gate structure and etching the portion of the byproduct so a remaining portion of the byproduct is formed on the top surface of the gate structure. The method further includes forming a gate contact structure, including depositing a metal material on the remaining portion of the byproduct to form a compound containing the metal material and the remaining portion of the byproduct. The method also includes forming a barrier layer between the compound and the top surface of the gate structure.

20 Claims, 15 Drawing Sheets

(51) Int. Cl.
*H10D 62/10* (2025.01)
*H10D 84/01* (2025.01)
*H10D 84/03* (2025.01)

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 11,437,477 B1 * | 9/2022 | Tsai ................... H01L 29/458 |
| 2004/0142557 A1 * | 7/2004 | Levy ................ C23C 16/0272 257/E21.171 |
| 2011/0318919 A1 * | 12/2011 | Horigome ......... H01L 21/76843 438/653 |
| 2014/0027664 A1 * | 1/2014 | Lei ...................... H10N 70/231 252/520.5 |
| 2015/0325484 A1 * | 11/2015 | Lin ...................... H01L 21/265 438/301 |
| 2018/0151439 A1 * | 5/2018 | Huang ................ H01L 27/0886 |
| 2018/0151441 A1 * | 5/2018 | Lin .................... H01L 21/3086 |
| 2019/0057861 A1 * | 2/2019 | Liang ............... H01L 21/31055 |
| 2019/0139969 A1 * | 5/2019 | Yin ........................ H10B 10/18 |
| 2019/0164829 A1 * | 5/2019 | Yang ................ H01L 21/76895 |
| 2022/0328626 A1 * | 10/2022 | Wu ................... H01L 21/76814 |
| 2022/0336615 A1 * | 10/2022 | Chiu ................. H01L 29/41725 |
| 2023/0386822 A1 * | 11/2023 | Chao ................ H01L 21/76814 |

* cited by examiner

CONTACT STRUCTURES FOR SEMICONDUCTOR DEVICES

CROSS-REFERENCE TO RELATED APPLICATION

The present application claims the benefit of U.S. Provisional Patent Appl. No. 63/173,169, titled "A Novel Contact Structure" and filed on Apr. 9, 2021, which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices and three-dimensional transistors, such as gate-all-around field effect transistors (GAAFETs) and fin field effect transistors (finFETs), have been introduced.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
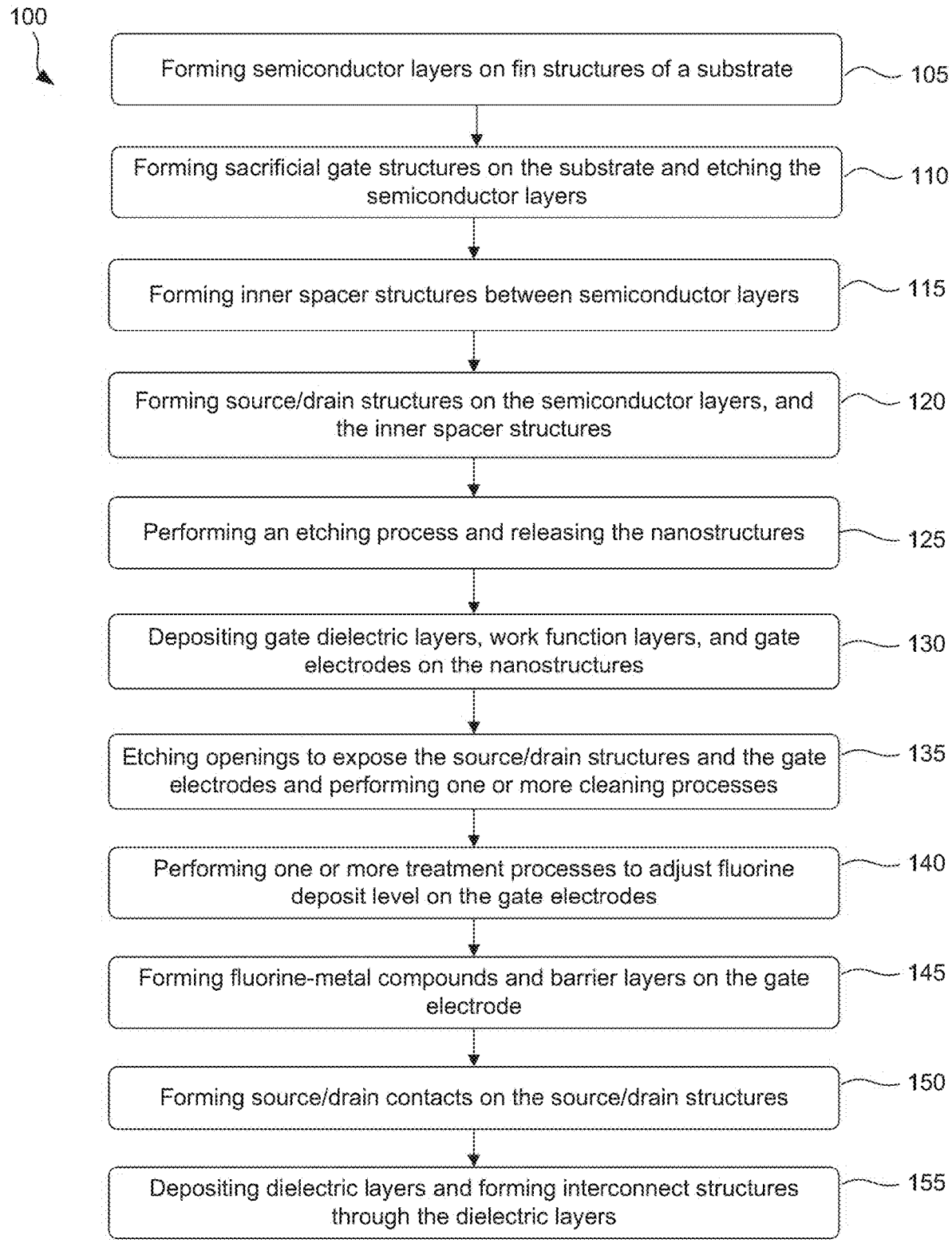
FIG. 1 is a flow diagram of a method for fabricating contact structures having fluorine-metal compounds, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, so the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate, such as a semiconductor wafer, or (ii) built with vertical structures.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value), 10% of the value, 20% of the value, etc.

The present disclosure provides example field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

The fins of finFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

GAAFETs and finFETs increase device density and improve device performance. GAAFETs and finFETs include a pair of source/drain regions formed on opposite sides of a channel region. The channel region is covered by a gate structure including gate dielectric layers, work function layers, and a metal gate electrode. The gate structure can be formed using a replacement gate process where a polysilicon gate is disposed on the channel region and replaced by a metal gate structure. Source/drain contacts and gate contacts are respectively formed on the source/drain regions and gate structures to provide electrical bias for controlling the transistor devices. Contact resistances for the source/drain contact and gate contacts are factors that can impact device performance. For example, a lower contact resistance is desired for achieving lower power consumption and faster operating speed. However, impedance match between the transistor devices and external circuitry may also play an important role in achieving nominal device performance, and it may be desirable to incorporate gate contact structures having similar impedances as the impedance of external circuitry connected to the gate structure. As the semiconductor industry continues to scale down the dimensions of semiconductor devices, circuit complexity has increased at all device levels. For example, beyond the 5 nm technology node or the 3 nm technology node, decreased gate length can increase the difficulty of achieving nominal gate contact resistance.

Various embodiments in the present disclosure describe methods for forming gate contact structures having nominal resistances. Specifically, a cleaning process performed on the gate structures to remove one or more oxide materials can dispose fluorine-containing material, such as ammonium hydrogen fluoride ($NH_4F.HF$), on top surfaces of the gate electrode. One or more treatment processes can remove portions of the fluorine-containing material so a nominal amount of fluorine-containing material remains on the top surface of the gate electrode. Metal material, such as titanium, is subsequently deposited on the top surface of the gate electrode and reacts with the fluorine-containing material to form a fluorine-containing metal compound. Conductive vias, such as tungsten, can be deposited on the fluorine-containing metal compound. In some embodiments, the amount of fluorine-containing metal compound formed between the gate electrode and the conductive via can be determined by the amount of fluorine-containing material after the treatment process and the amount of subsequently-deposited metal material. A greater amount of fluorine-containing metal compound can provide a gate contact structure having a greater resistance. The gate contact structure described in the present application provides various benefits, such as adjustable gate contact resistance by varying the treatment and deposition processing conditions. The gate contact resistance can be increased or decreased to match the impedance of subsequently formed external circuitry, which in turn improves device performance and reliability. The embodiments described herein use GAAFETs as examples and can be applied to other semiconductor structures, such as finFETs and planar FETs. In addition, the embodiments described herein can be used in various technology nodes, such as 14 nm, 7 nm, 5 nm, 3 nm, 2 nm, and lower technology nodes.

FIG. 1 is a flow diagram of a method 100 for fabricating a semiconductor device incorporating resistance-adjustable gate contacts, according to some embodiments. For illustrative purposes, the operations illustrated in FIG. 1 will be described with reference to the example fabrication process of fabricating a semiconductor device 200 as illustrated in FIGS. 2A-2D, 3A, 3B, and 4-13. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein.

Figures 2A, 2B:
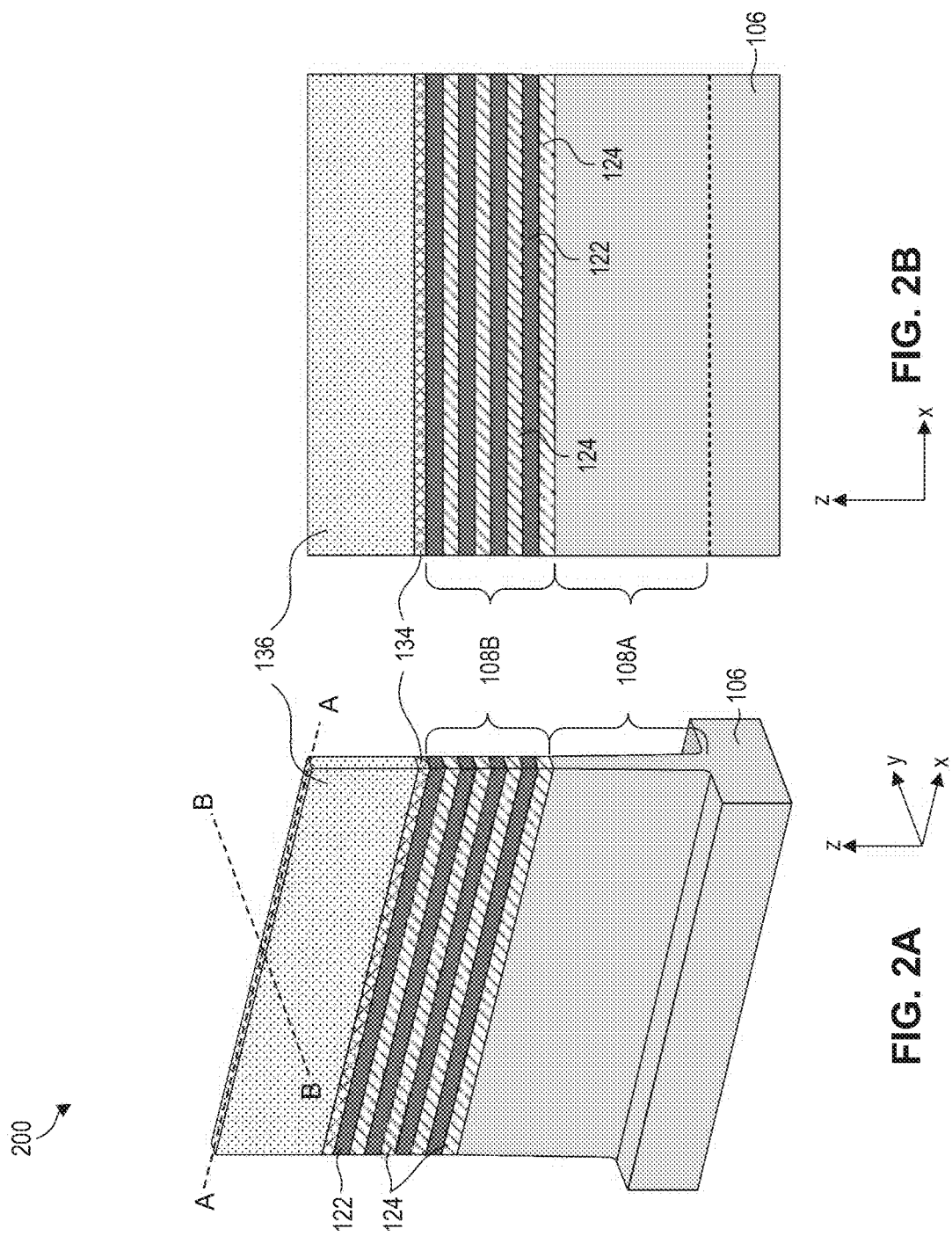
FIGS. 2A-2D, 3A, 3B, and 4-7 illustrate various cross-sectional views of semiconductor devices at various stages of their fabrication process, in accordance with some embodiments.
Figure 2D:
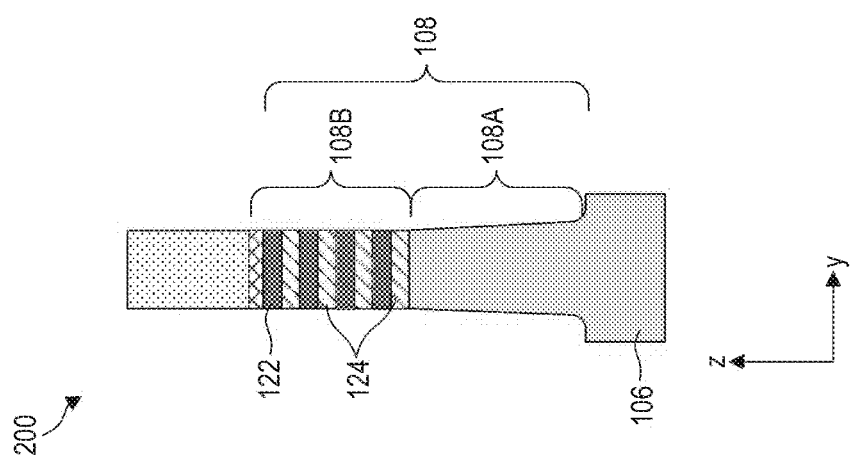
Figure 2C:
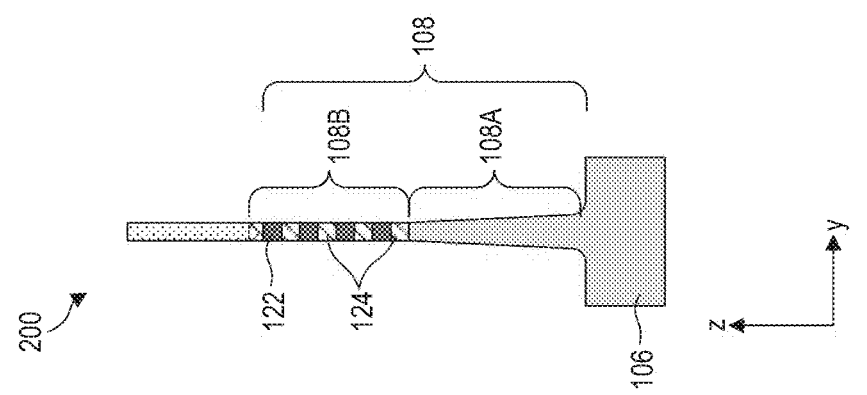

Referring to FIG. 1, in operation 105, semiconductor layers are formed on fin structures of a substrate, according to some embodiments. For example, fin structure 108 with fin base portion 108A and fin top portion 108B can be formed on substrate 106 as described with reference to semiconductor device 200 illustrated in FIGS. 2A-2C. FIG. 2B is a cross-sectional view of the structure in FIG. 2A as viewed from the A-A line. FIG. 2C is a cross-sectional view of the structure in FIG. 2A as viewed from the B-B line. The formation of fin structure 108 can include the formation of fin base portion 108A and fin top portion 108B on substrate 106. FIGS. 2A-2C illustrate semiconductor layers formed in a wire configuration (e.g., cross-sectional area having a substantially square shape). Alternatively, semiconductor layers of semiconductor device 200 can also be formed in a sheet configuration (e.g., cross-sectional area having a substantially rectangular shape), as illustrated in FIG. 2D.

Substrate 106 can be a semiconductor material, such as silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Fin structure 108 extends along an x-axis. Fin structure 108 can be a part of a substrate and include a fin base portion 108A and a fin top portion 108B disposed on fin base portion 108A.

Fin base portion 108A can include material similar to substrate 106. Fin base portion 108A can be formed from a photolithographic patterning and an etching of substrate 106. Fin top portion 108B can include a stack of semiconductor layers. Each semiconductor layer can be subsequently processed to form a channel region underlying subsequently-formed gate structures of the finFETs.

Fin top portion 108B includes a first group of semiconductor layers 122 and a second group of semiconductor layers 124 stacked in an alternating configuration. Each of semiconductor layers 122 and 124 can be epitaxially grown on its underlying layer and can include semiconductor materials different from each other. In some embodiments, semiconductor layers 122 and 124 can include semiconductor materials similar to or different from substrate 106. In some embodiments, semiconductor layers 122 and 124 can include semiconductor materials with oxidation rates and/or etch selectivities different from each other. In some embodiments, each of semiconductor layers 122 can be formed of silicon and each of semiconductor layers 124 can be formed of silicon germanium. In some embodiments, semiconductor layers 122 can be formed of silicon germanium and semiconductor layers 124 can be formed of silicon. Semiconductor layers 122 and/or semiconductor layers 124 can be undoped or can be in-situ doped during their epitaxial growth process using (i) p-type dopants, such as boron, indium, and gallium; and/or (ii) n-type dopants, such as phosphorus and arsenic. For p-type in-situ doping, p-type doping precursors, such as diborane, boron trifluoride, and any other p-type doping precursor, can be used. For n-type in-situ doping, n-type doping precursors, such as phosphine and arsine, can be used. Though four layers for each of semiconductor layers 122 and semiconductor layers 124 are shown in FIGS. 2A-2C, semiconductor device 200 can have any suitable number of semiconductor layers 122 and semiconductor layers 124.

Forming fin base portion 108A and fin top portion 108B can also include etching the aforementioned stack of materials through patterned hard mask layers 134 and 136 formed on the stack of materials. In some embodiments, hard mask layer 134 can be a thin film including silicon oxide formed using, for example, a thermal oxidation process. In some embodiments, hard mask layer 136 can be formed of silicon nitride using, for example, low-pressure chemical vapor deposition (LPCVD) or plasma-enhanced chemical vapor deposition (PECVD). The etching of the stack of materials can include a dry etch, a wet etch process, or a combination thereof. Hard mask layers 134 and 136 can be removed after fin structures 108 are formed.

Fin top portions 108B can be formed using stacks of semiconductor layers 122 and 124 in a wire configuration, as shown in FIG. 2C. For example, semiconductor layers 122 and 124 in FIG. 2C have a substantially square-shaped cross-sectional area. In some embodiments, fin top portions 108B can be formed using stacks of semiconductor layers 122 and 124 in a sheet configuration, as shown in FIG. 2D. For example, semiconductor layers 122 and 124 in FIG. 2C have a substantially rectangular-shaped cross-sectional area. FIGS. 3A, 3B, and 4-8 illustrate forming semiconductor devices with semiconductor layers in a wire configuration that subsequently form nanosheet structures. The method illustrated in the present disclosure also applies to semiconductor devices with semiconductor layers in the sheet configuration that subsequently form nanosheet structures.

Figure 3A:
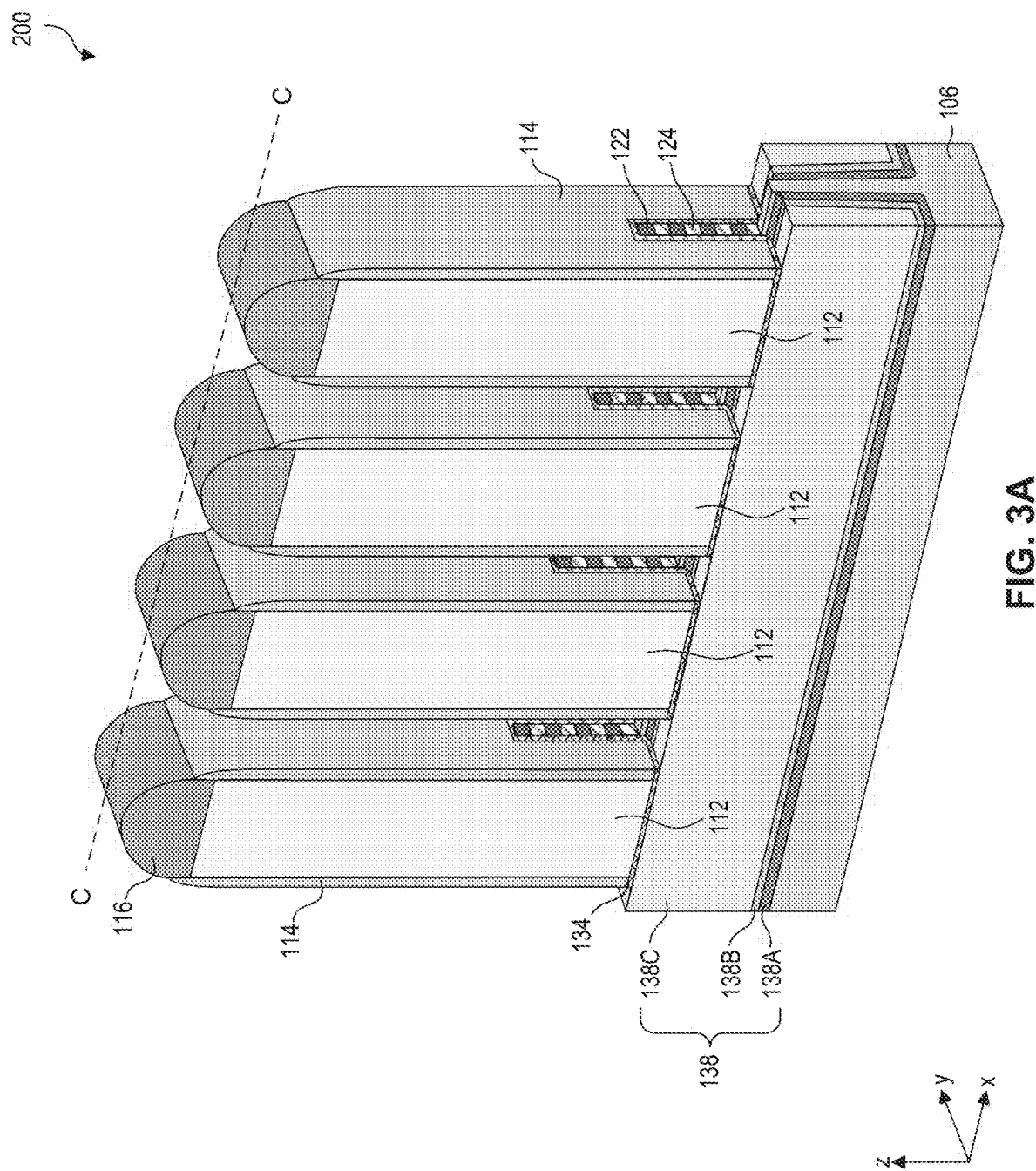
Figure 3B:
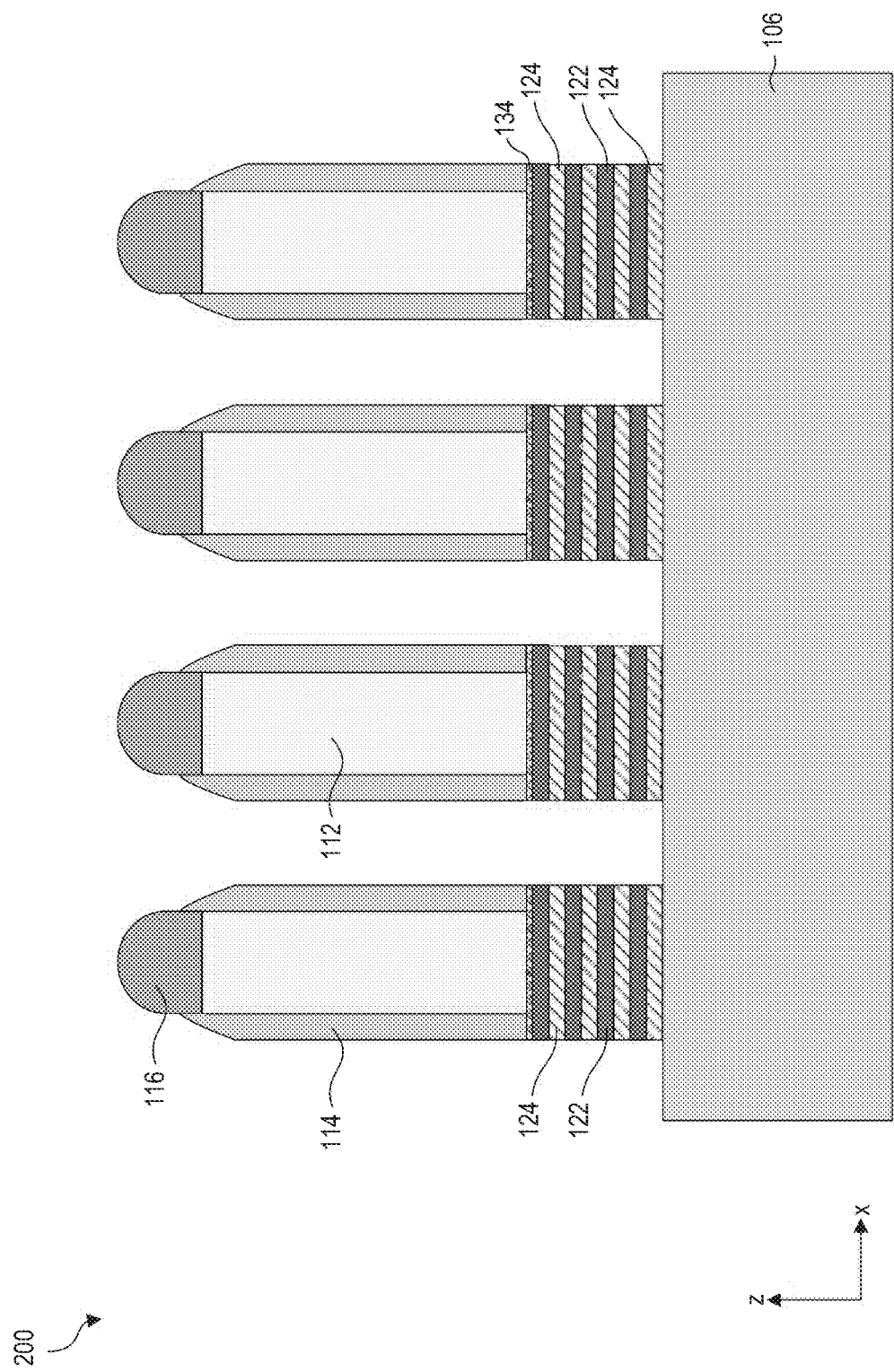

Referring to FIG. 1, in operation 110, sacrificial gate structures are formed on the substrate and the semiconductor layers are etched, according to some embodiments. Referring to FIGS. 3A and 3B, STI regions 138 with first and second protective liners 138A and 138B and insulating layer 138C can be formed on substrate 106. FIG. 3B is a cross-sectional view of semiconductor device 200 in FIG. 3A as viewed from the C-C line. In some embodiments, substrate 106 can include fin bottom portion 108A and are collectively referred to as substrate 106 for simplicity. In some embodiments, hard mask layer 136 remains on the top surfaces of hard mask layer 134 after the formation of STI regions 138. In some embodiments, hard mask layer 136 is removed prior to the formation of STI regions 138. Forming STI regions 138 can include (i) depositing a layer of nitride material (not shown) for first protective liners 138A on the structure of FIG. 2A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 3A. The layers of nitride and oxide materials can be deposited using a suitable process for depositing oxide and nitride materials, such as atomic layer deposition (ALD) and chemical vapor deposition (CVD). These layers of oxide and nitride materials can prevent oxidation of the sidewalls of fin top portion 108B during the deposition and annealing of the insulating material for insulating layer 138C. In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane and oxygen as reacting precursors. In some embodiments, the layer of insulating material can be formed using a sub-atmospheric CVD (SACVD) process or high aspect-ratio process (HARP), where process gases can include tetraethoxysilane (TEOS) and/or ozone.

Polysilicon gate structures 112 are formed on STI regions 138, as shown in FIGS. 3A and 3B. Polysilicon gate structures 112 are sacrificial gate structures and can be replaced in a gate replacement process to form metal gate structures. In some embodiments, the formation of polysilicon gate structures 112 can include blanket depositing a layer of polysilicon material and etching the layer of polysilicon material through a patterned hard mask layer 116 formed on the layer of polysilicon material. In some embodiments, the layer of polysilicon material can be undoped and hard mask layer 116 can include an oxide layer and/or a nitride layer. The oxide layer can be formed using a thermal oxidation process and the nitride layer can be formed by LPCVD or PECVD. Hard mask layer 116 can protect polysilicon gate structures 112 from subsequent processing steps (e.g., during formation of spacers 114 and/or source/drain regions). The blanket deposition of the layer of polysilicon material can include CVD, physical vapor deposition (PVD), ALD, or any other suitable deposition process. In some embodiments, etching of the deposited layer of polysilicon material can include a dry etch, a wet etch, or a combination thereof. Spacers 114 can be formed on sidewalls of polysilicon gate structures 112. Forming spacers 114 can include blanket depositing a layer of an insulating material (e.g., an oxide, a nitride, and/or silicon carbon oxynitride material) followed by photolithography and an etching process (e.g., reactive ion etching or any other suitable dry etching process using a chlorine- or fluorine-based etchant).

Fin top portions can be etched after polysilicon gate structures 112 are formed. The etch process can remove portions of semiconductor layers 122 and 124 that are exposed between adjacent polysilicon gate structures 112. In some embodiments, the etching process can be a cyclic etching process for removing materials that form semiconductor layers 122 and 124, such as etching processes for removing silicon and silicon germanium materials. For example, the etch process can include a wet etch process using, for example, diluted hydrofluoric acid for etching silicon germanium and tetramethylammonium hydroxide (TMAH) for etching silicon material. In some embodiments, one or more etching processes can be used. During the etching process, polysilicon gate structures 112 can be protected by spacers 114 and hard mask layer 116.

Figure 4:
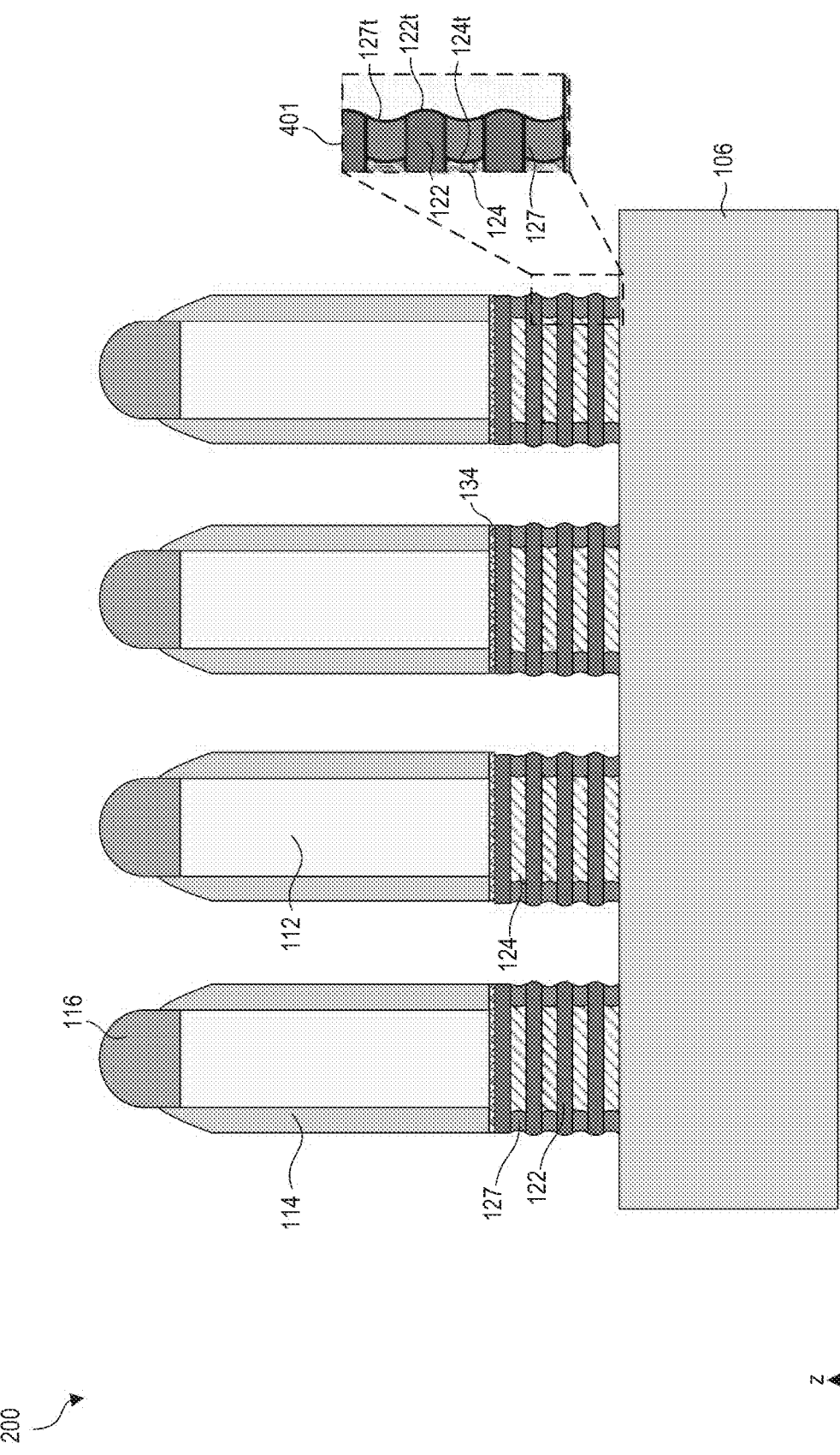

Referring to FIG. 1, in operation 115, inner spacer structures are formed between the semiconductor layers, according to some embodiments. Referring to FIG. 4, portions of semiconductor layers 124 can be etched back to form recessed regions and dielectric material can be deposited in the recessed regions to form inner spacers 127. For example, semiconductor device 200 shown in FIG. 4 can include n-type metal-oxide-semiconductor (NMOS) devices and portions of semiconductor layers 124 are etched back. In some embodiments, substrate 106 can include fin bottom portion 108A and are collectively referred to as substrate 106 for simplicity.

Semiconductor device 200 illustrated in FIG. 4 can include semiconductor layers 124 and substrate 106 formed using silicon germanium and semiconductor layers 122 formed using silicon. In some embodiments, substrate 106 can be an intrinsic material or doped with suitable dopants. For example, substrate 106 can have a non-uniform dopant concentration. Semiconductor device 200 can also include p-type metal-oxide-semiconductor (PMOS) devices. PMOS device configurations are not shown in FIG. 4 for simplicity. For the PMOS device configurations, semiconductor layers 124 can be processed to be used as the channel regions. Semiconductor layers 122 can be etched back using suitable etching processes and inner spacers 127 can be formed between adjacent semiconductor layers 124 using similar deposition and etching processes described below with respect to the etch back of semiconductor layers 124 and the formation of inner spacers 127.

Semiconductor layers 124 can be etched back by a dry etching process, a wet etching process, or a combination thereof. The etch back process of semiconductor layers 124 can be configured to form non-planar outer surfaces of semiconductor layers 122 and 124. For example, the etching process can include alternating cycles of etching and purging processes. The etching process in each cycle can include using a gas mixture having hydrogen fluoride, nitrogen trifluoride, a fluorine-based gas, and/or a chlorine-based gas. As shown in enlarged view 401 of FIG. 4, semiconductor layers 122 can have curved convex outer surfaces 122t and semiconductor layers 124 can have curved concave outer surfaces 124t. In some embodiments, subsequently-formed inner spacers 127 can also have outer surfaces 127t that substantially contour outer surface 124t of semiconductor layers 124.

Figure 5:
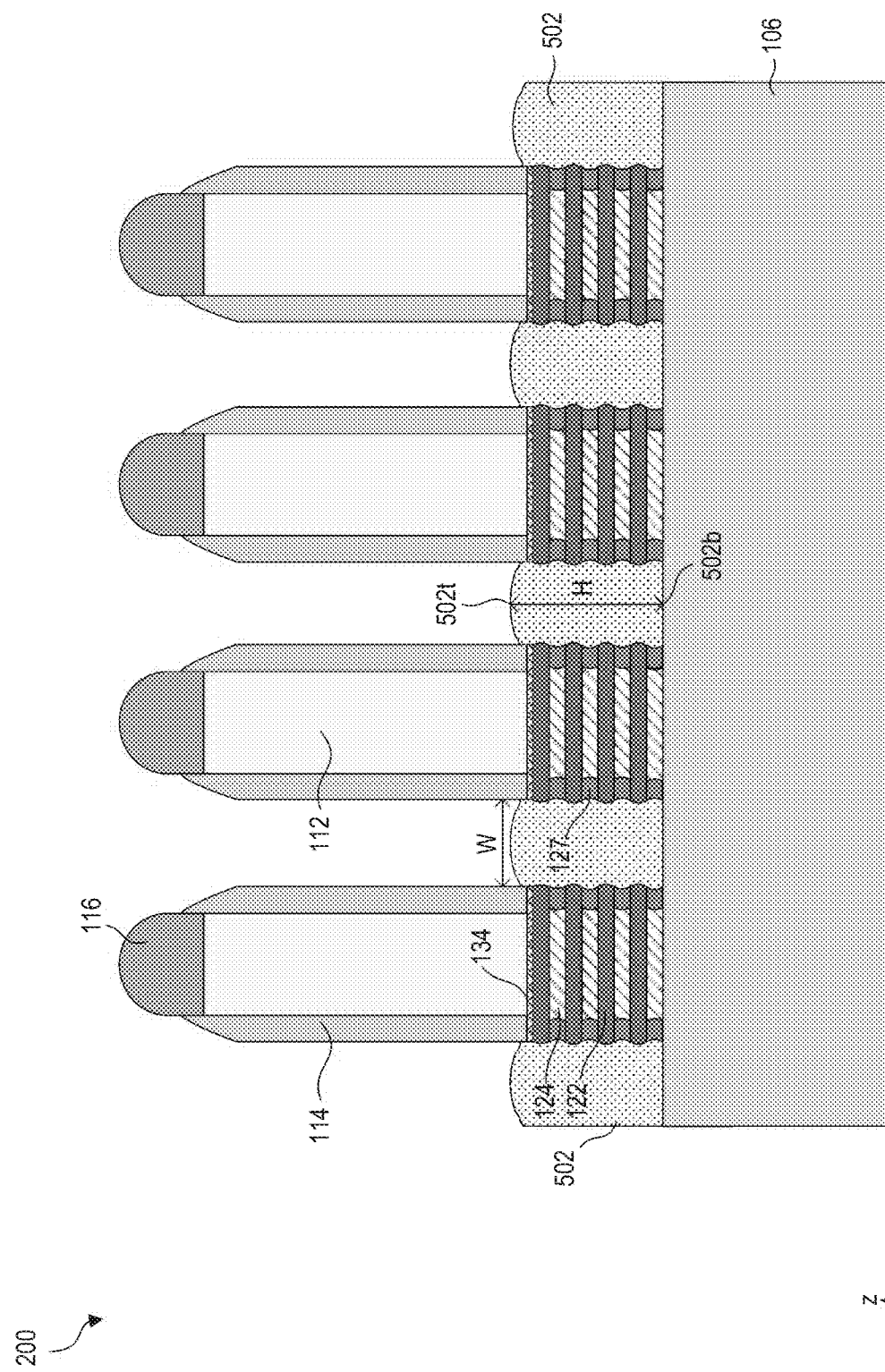

Referring to FIG. 1, in operation 120, source/drain structures are formed on the semiconductor layers and the inner spacer structures, according to some embodiments. Referring to FIG. 5, source/drain structures 502 can be formed on outer surfaces of semiconductor layers 122 and inner spacers 127. Source/drain structures 502 are also in contact with top surfaces of substrate 106. In some embodiments, source/drain structure 502 can be formed by a selective growth process where a semiconductor material is grown on selective surfaces. For example, source/drain structure 502 can be formed by epitaxially growing a crystalline material using top surfaces of substrate 106 as seed layers.

Source/drain structures 502 can be formed of silicon, silicon germanium, silicon phosphide, any suitable semiconductor material, and combinations thereof. In some embodiments, source/drain structures 502 can be doped with suitable dopants, such as boron and phosphorus. Source/drain structures 502 can be formed using suitable deposition or growth methods, such as (i) CVD, including but not limited to, LPCVD, atomic layer CVD (ALCVD), ultrahigh vacuum CVD (UHVCVD), reduced pressure CVD (RPCVD), and any other suitable CVD; (ii) molecular beam epitaxy (MBE) processes; (iii) any suitable epitaxial process; and (iv) a combination thereof. In some embodiments, source/drain structure 502 can be grown by an epitaxial deposition/partial etch process, which repeats the epitaxial deposition/partial etch process at least once. Such repeated deposition/partial etch process is also called a cyclic deposition-etch (CDE) process. In some embodiments, a plasma deposition process using species, such as germane, dichlorosilane, and hydrochloride, can be used to deposit source/drain structure 502 formed of silicon germanium. A width W of source/drain structure 502 can be between about 10 nm and about 80 nm, between about 15 nm and about 75 nm, between about 20 nm and about 60 nm, or any suitable dimension. In some embodiments, a height H of source/drain structure 502 measured from top surface 502t of source/drain structure 502 and bottom surface 502b can be between about 20 nm and about 140 nm, between about 30 nm and about 120 nm, between about 40 nm and about 100 nm, or any suitable dimension.

Figure 6:
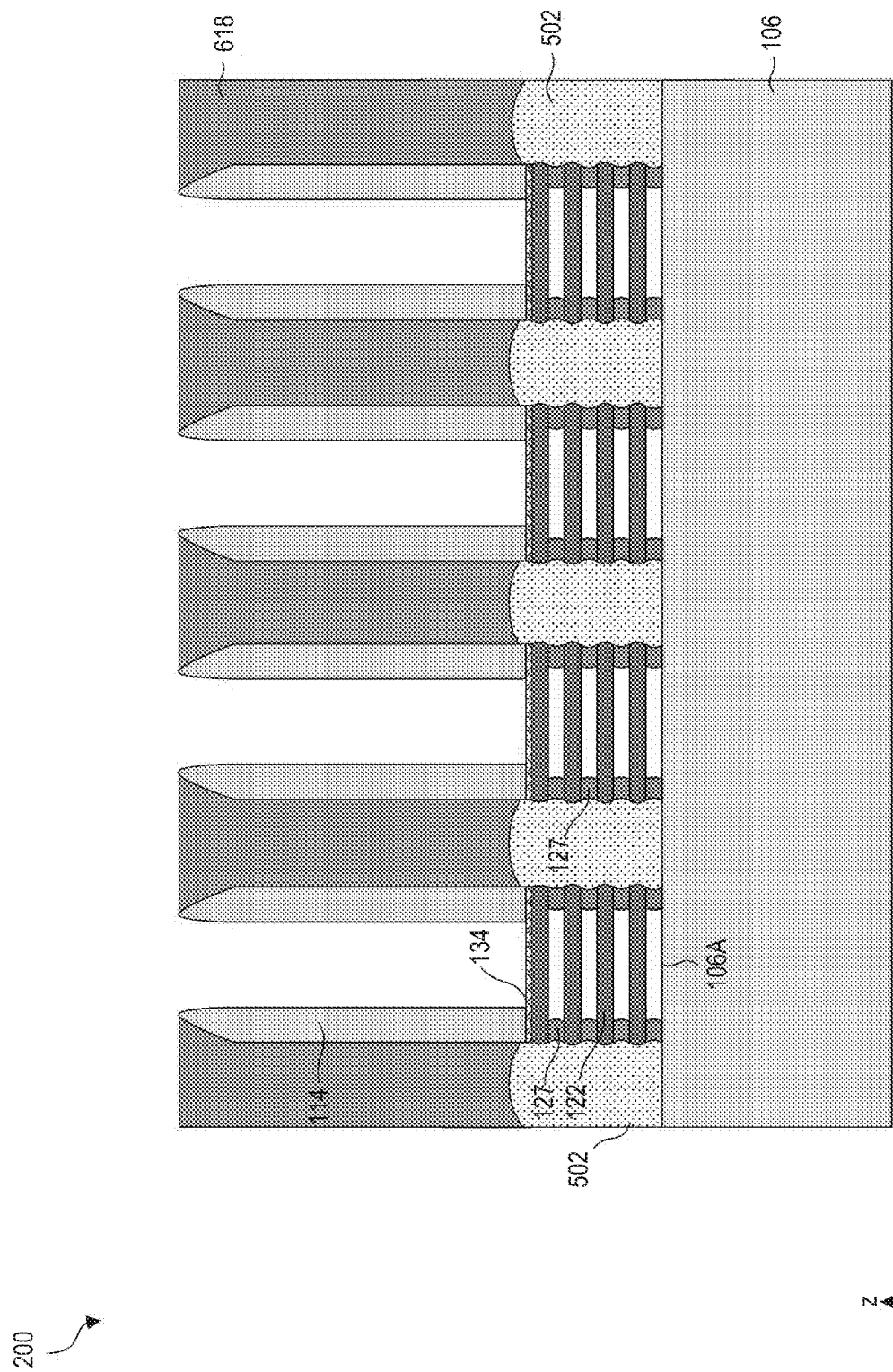

Referring to FIG. 1, in operation 125, etching processes are performed and nanostructures are released (e.g., exposed), according to some embodiments. Referring to FIG. 6, semiconductor layers 124 are removed, exposing portions of semiconductor layer 122 formed between opposite inner spacers 127. The exposed semiconductor layers can be referred to as nanostructures (e.g., nanowires or nanosheets). In some embodiments, semiconductor layers 122 are removed (not illustrated in FIG. 6) and semiconductor layers 124 form nanostructures.

Prior to the release of the nanostructures, an interlayer dielectric (ILD) layer 618 can be deposited between spacers 114 and polysilicon gate structures 112 are removed, according to some embodiments. ILD layer 618 can be disposed on source/drain structure 502 of the source/drain regions and between spacers 114. ILD layer 618 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. Other materials and formation methods for ILD layer 618 are within the scope and spirit of this disclosure.

The formation of ILD layer 618 can be followed by removing polysilicon gate structures 112 and semiconductor layers 124 using a dry etching process (e.g., reaction ion etching) or a wet etching process and exposing portions of semiconductor layers 122. The exposed semiconductor layers 122 can be referred to as nanostructures (e.g., nanowires or nanosheets). Depending on the type of devices being formed, semiconductor layers 122 can be removed, exposing portions of semiconductor layers 124, which can also be referred to as nanostructures. In some embodiments, the gas etchants used in the dry plasma etching process can include hydrogen and radicals, such as chlorine, fluorine, bromine, and a combination thereof. For example, the gas etchants can include hydrogen bromide, hydrogen chloride, or any suitable gas etchant. In some embodiments, wet chemical etching can be used. Etchants for the wet chemical etching process can include ozone mixed with one or more of hydrogen fluoride, hydrogen chloride, hydrogen peroxide, or any suitable chemical etchant. In some embodiments, a dry etch followed by a wet etch process can be used.

Figure 7:
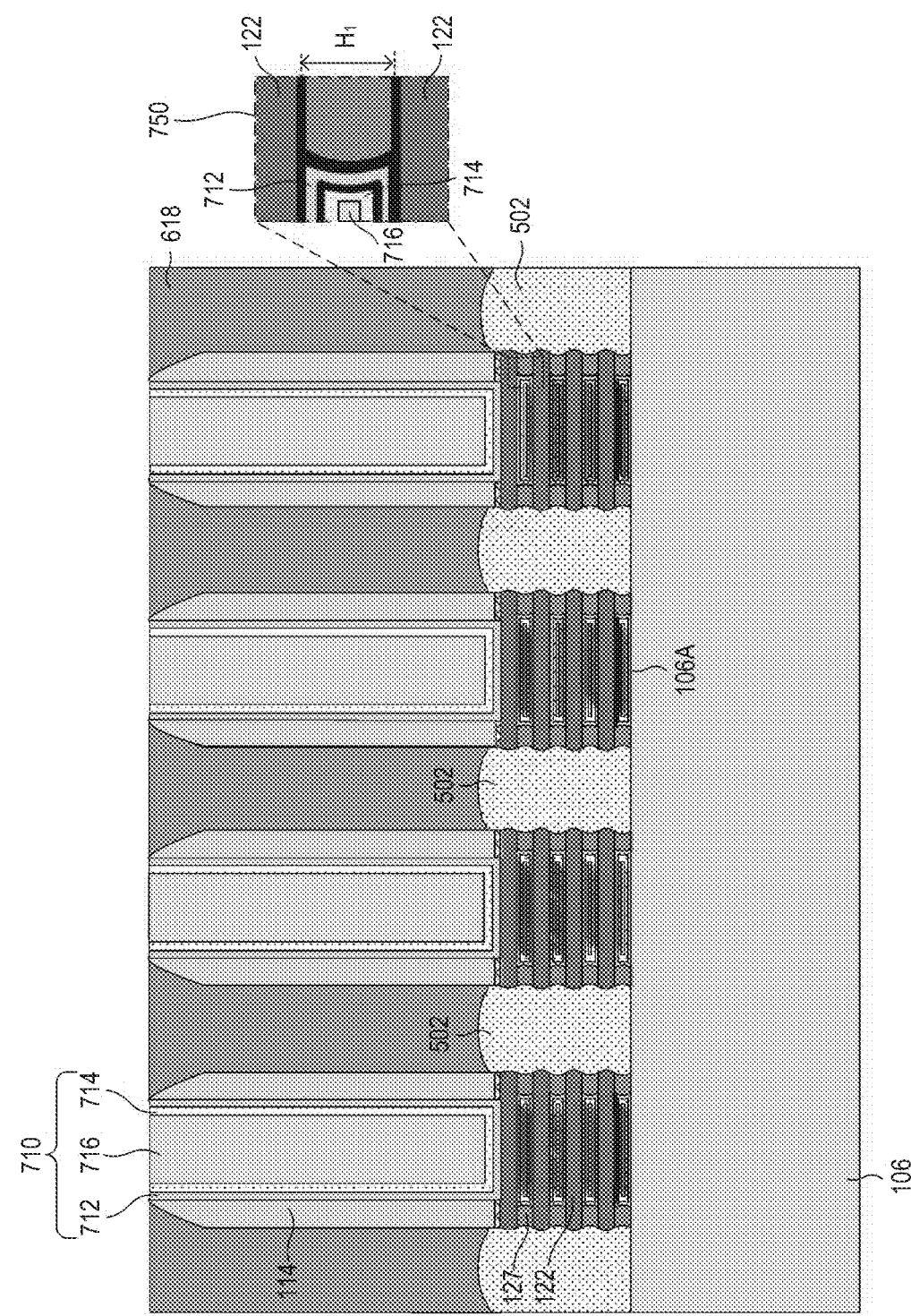

Referring to FIG. 1, in operation 130, gate dielectric layers, work function layers, and gate electrodes are deposited on the nanostructures, according to some embodiments. Referring to FIG. 7, a gate stack 710 including gate dielectric layers 712, work function layers 714, and gate electrode 716 are formed on semiconductor layers 122 and on substrate 106. Gate dielectric layers 712 can be formed on the semiconductor layers. In some embodiments, gate dielectric layers 712 can be wrapped around exposed nanostructure-shaped semiconductor layers 122. In some embodiments, semiconductor layers 122 can be nanosheets or nanowires. Forming gate dielectric layers 712 can include a blanket deposition process of a suitable gate dielectric material layer. In some embodiments, gate dielectric layers 712 can be formed of a high-k dielectric material (e.g., dielectric material having dielectric constant greater than about 3.9). For example, gate dielectric layers 712 can be formed of hafnium oxide. In some embodiments, one or more gate dielectric layers can be formed. Work function layers 714 are formed on gate dielectric layers 712. In some embodiments, each work function layer 714 can include one or more work function metal layers and be formed using the same or different material and/or thickness. In some embodiments, work function layers can include titanium nitride and/or titanium aluminum alloy. Gate dielectric layers 712 and gate work function layers 714 can each wrap around nanostructure-shaped semiconductor layers 122. Depending on the spaces between adjacent semiconductor layers 122, semiconductor layers 122 can be wrapped around by gate dielectric layer 712 and work function layers 714, filling the spaces between adjacent semiconductor layers 122. In some embodiments, subsequently-formed gate electrode material can also be formed in the spaces between adjacent semiconductor layers 122, as illustrated in enlarged view 750 and described below.

Gate electrodes 716 can be formed on the work function layers, according to some embodiments. Layers of conductive material for gate electrodes 716 are formed on work function layers 714. As shown in enlarged view 750, if separations between adjacent semiconductor layers 122 are sufficient to accommodate the thickness of the gate electrode material, gate electrodes 716 can be formed between adjacent semiconductor layers 122 and on work function layers 714 so the spaces between adjacent semiconductor layers 122 are filled. Gate electrodes 716 that are between adjacent semiconductor layers 122 and gate electrodes 716 that are formed between spacers 114 are electrically coupled to each other. The layer of conductive material for gate electrodes 716 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and combinations thereof. Gate electrodes 716 can be formed by ALD, PVD, CVD, or any other suitable deposition process. The deposition of gate electrodes 716 can continue until openings between opposite spacers 114 are filled with gate electrodes 716. A chemical mechanical polishing process can remove excessive gate electrodes 716 so top surfaces of gate electrodes 716 and ILD layer 618 are substantially coplanar. In some embodiments, other structures can be formed, such as blocking layers. One or more blocking layers (not shown in FIG. 7) can be formed prior to depositing gate electrodes 716 to prevent diffusion and oxidation of gate electrodes 716.

Enlarged view 750 illustrates portions of the gate structure formed between adjacent semiconductor layers 122. As shown in enlarged view 750, inner spacers 127 can have height Hi as measured between opposite surfaces from adjacent nanostructures, such as semiconductor layers 122. In some embodiments, height Hi can be between about 3 nm and about 10 nm, between about 5 nm and about 7 nm, or any suitable height.

Figure 8:
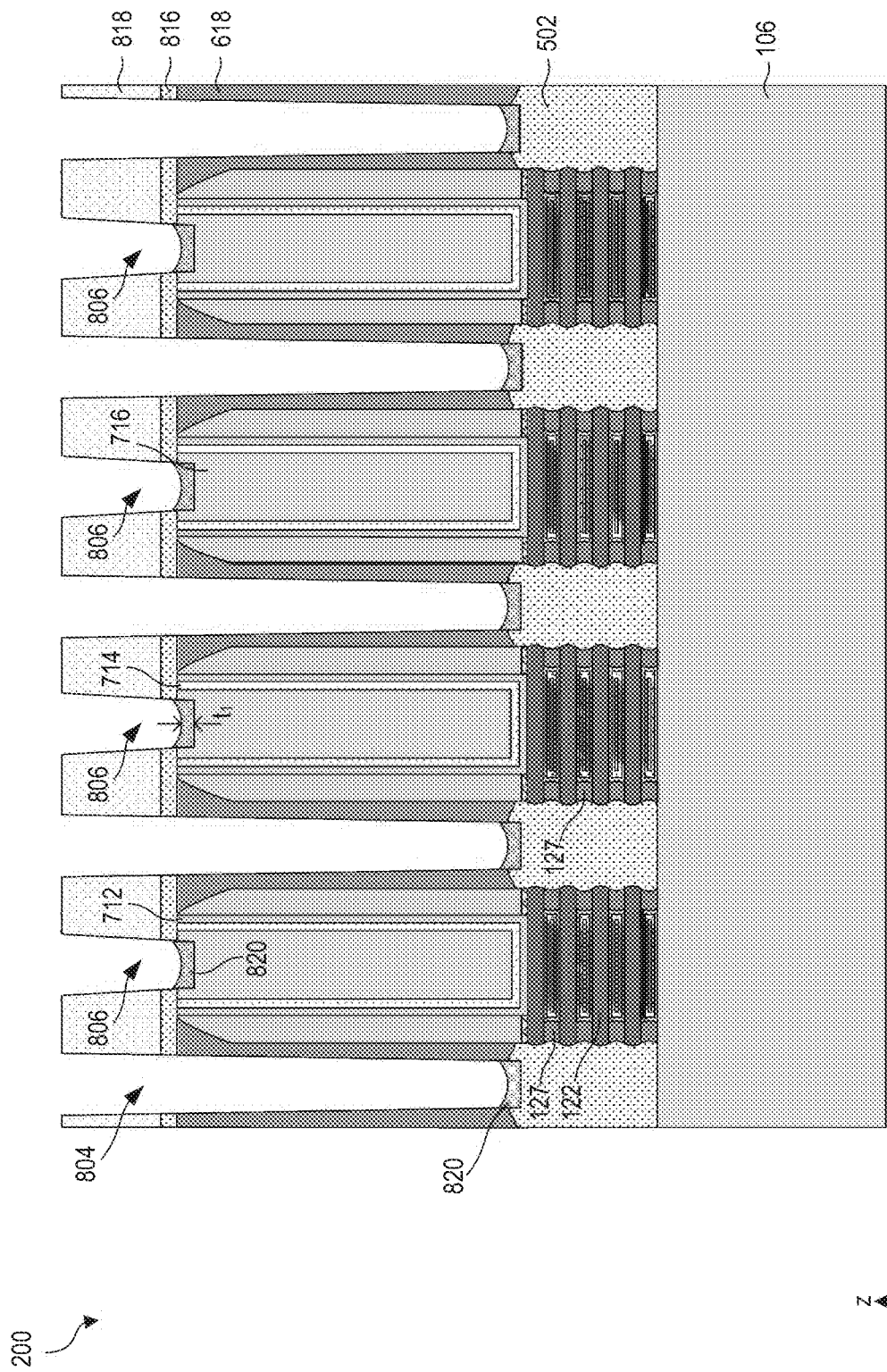
FIGS. 8-13 illustrate various cross-sectional views of semiconductor devices incorporating contact structures having fluorine-metal compounds at various stages of their fabrication process, in accordance with some embodiments.

Referring to FIG. 1, in operation 135, openings are formed to expose the source/drain structures and gate electrodes and one or more cleaning processes are performed, according to some embodiments. Referring to FIG. 8, etching processes are performed to form openings 804 and 806 to expose underlying source/drain structures 502 and gate electrodes 716, respectively. One or more cleaning processes can be used to remove an oxide from exposed source/drain structures 502 and gate electrodes 716. After the oxide is removed, byproducts 820 of the one or more cleaning processes are formed at top surfaces of source/drain structures 502 and gate electrodes 716.

In some embodiments, dielectric layers 816 and 818 are deposited on ILD layer 618 and gate stack 710 prior to the formation of openings. In some embodiments, dielectric layers 816 and 818 can be formed using different materials and dielectric layer 816 can be an etch stop layer. In some embodiments, dielectric layer 816 can be formed using silicon oxynitride and dielectric layer 818 can be formed using silicon oxide. Dielectric layers 816 and 818 can be deposited using any suitable deposition method, such as CVD, PECVD, FCVD, LPCVD, ALD, and any combinations thereof.

In some embodiments, openings 804 and 806 can be formed by patterning and anisotropic etching processes that etches portions of dielectric layers 816 and 818 as well as ILD 618. The etching processes can be a dry etching process for removing the respective dielectric material of the aforementioned layers. In some embodiments, reactive ion etch (RIE) etching processes or wet chemical etching processes can be used. In some embodiments, the chemical etchants can include ammonium hydroxide, hydrogen peroxide, hydrofluoric or alkaline-based etchant, sulfur hexafluoride, any suitable chemical etchant, and combinations thereof. The etching processes continues until top surfaces of source/drain structures 502 and gate electrode 716 are exposed. In some embodiments, openings 806 extend into gate electrode 716. For example, a bottom surface of openings 806 is below a top surface of gate electrode 716, as shown in FIG. 8.

The etching processes to form openings 804 and 806 may also oxidize the exposed top surfaces of source/drain structures 502 and gate electrode 716. Therefore, a cleaning process can be performed to remove the oxide. In some embodiments, the cleaning process can be performed using a plasma incorporating fluorinated chemical species. For example, the plasma process used for removing oxidization can use partially or fully fluorinated hydrocarbon, sulfur hexafluoride, and combinations thereof. In some embodiments, ammonium can also be mixed with the fluorinated chemical species and used during the cleaning process. Although the cleaning process can remove oxidization from the top surfaces of source/drain structures 502 and gate electrode 716, it may also deposit fluoride-containing byproducts 820 on the top surfaces as a result of the chemical reactions between the fluorinated chemical species and the oxide material. In some embodiments, byproducts 820 can be a fluorine-containing material, such as ammonium hydrogen fluoride. In some embodiments, byproducts 820 can also contain one or more metal elements in addition to fluorine. In some embodiments, byproducts 820 within opening 806 can have a thickness $t_1$ between about 30 Å and about 60 Å, between about 35 Å and about 55 Å, between about 40 Å and about 50 Å, or any suitable thickness. in some embodiments, byproducts 820 formed in openings 806 can have a greater thickness than byproducts 820 formed in openings 804.

Figure 9:
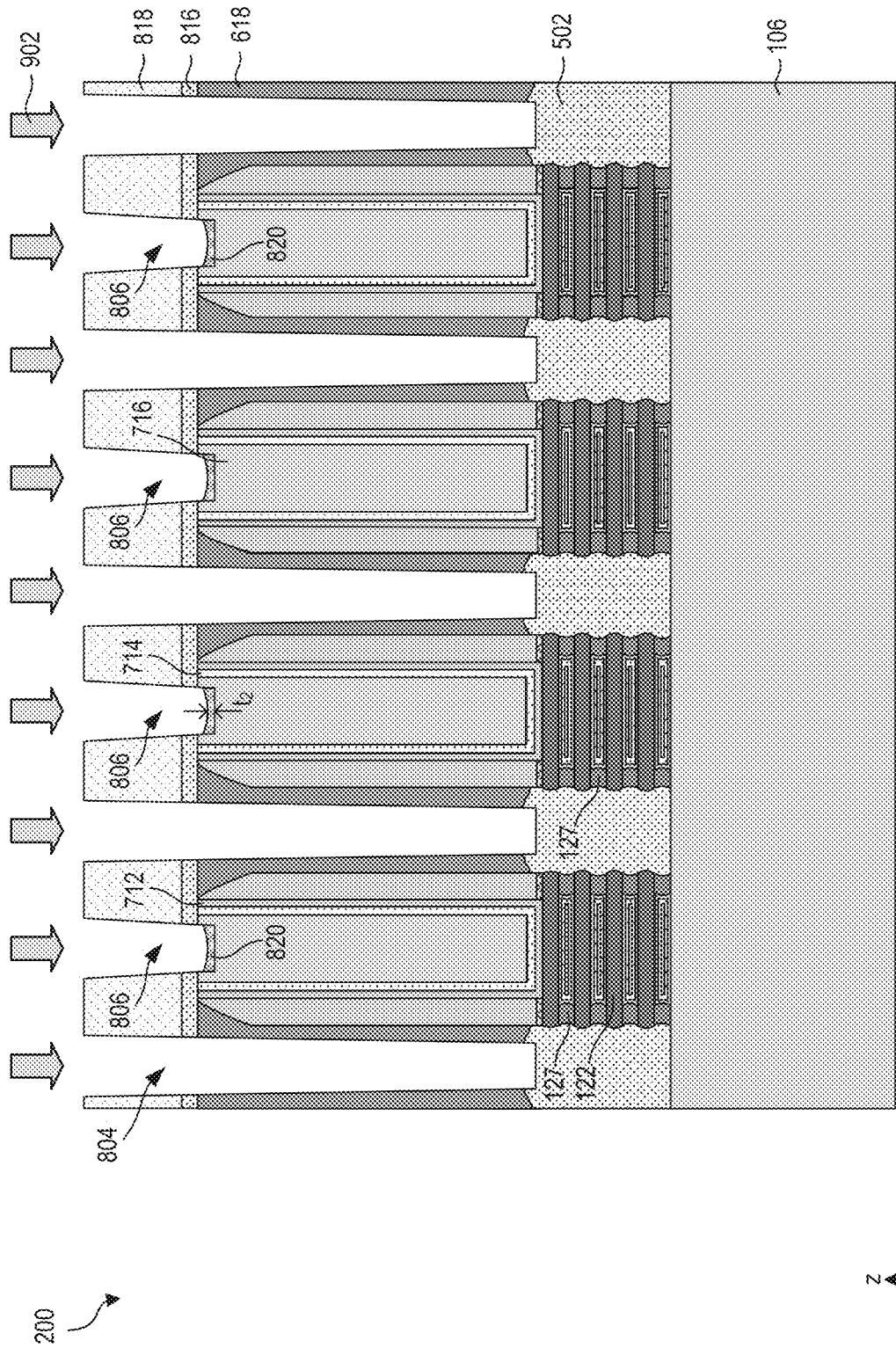

Referring to FIG. 1, in operation 140, one or more treatment processes are performed to adjust a fluorine deposit level on the gate electrodes, according to some embodiments. Referring to FIG. 9, treatment processes 902 can be performed to remove byproducts 820 from openings 804 and 806. As byproduct 820 can be formed using a fluorine-containing material, such as ammonium hydrogen fluoride, the fluorine deposit level can be adjusted by adjusting the amount of byproduct 820 remaining on the top surface of gate electrode 716. For example, thickness $t_1$ of byproduct 820 can be reduced to thickness $t_2$ after treatment process 902. In some embodiments, thickness $t_2$ can be between about 20 Å and about 35 Å. For example, thickness $t_2$ can be between about 22 Å and about 33 Å, between about 25 Å and about 30 Å, or any suitable thickness. In some embodiments, a ratio of $t_2$ over $t_1$ can be between about 30% and about 70%. In some embodiments, a greater thickness $t_2$ can provide the benefit of having a variable (e.g., a greater)

gate contact resistance, which in turn can be matched to an impedance of subsequently-formed contacts or interconnects. In some embodiments, openings 804 formed over source/drain structures 502 can have lower aspect ratios (e.g., a ratio of height over width of an opening) than openings 806 formed over gate electrodes 716. The lower aspect ratio allows treatment process 902 to remove byproduct 820 at a greater removal rate from openings 804 than from openings 806. Therefore, in some embodiments, byproduct 820 can be completely removed from openings 804 and partially removed from openings 806. As byproduct 820 is a fluorine-containing material, adjusting the fluorine deposit level on gate electrode 716 can be achieved by controllably and partially removing byproduct 820 processes from openings 806.

Byproduct 820 can be removed using any suitable process, such as a multi-cycle degas process performed at an elevated temperature. In some embodiments, the multi-cycle degas process is performed at a temperature between about 300° C. and about 500° C. For example, the multi-cycle degas process can be performed between about 380° C. and about 420° C. In some embodiments, the multi-cycle degas process can include an active plasma etching process performed in a reactive ion etching chamber. For example, the multi-cycle degas process can be argon plasma etching in the presence of a plasma-enhancing carrier gas, such as carbon dioxide, or an inert gas, such as helium, xenon, neon, and krypton. In some embodiments, the degas process can be performed in a physical vapor deposition (PVD) chamber, an RF sputtering chamber, a magnetron sputtering chamber, an ionized metal plasma (IMP) chamber, a self-ionized plasma (SIP) sputtering chamber, and the like. In some embodiments, the multi-cycle degas process can be performed in one or more cycles. For example, each cycle can include a plasma-activated etching process performed for a pre-determined amount of time, and the cycle can be repeated two or more times until a nominal amount of byproduct 820 remains on the top surface of gate electrode 716. In some embodiments, each cycle can be performed for between about 40 s and about 100 s, between about 50 s and about 90 s, between about 60 s and about 80 s, or any suitable amount of time. In some embodiments, the cycle can be performed between 2 and 5 times, such as 3 and 4 times.

Figure 10:
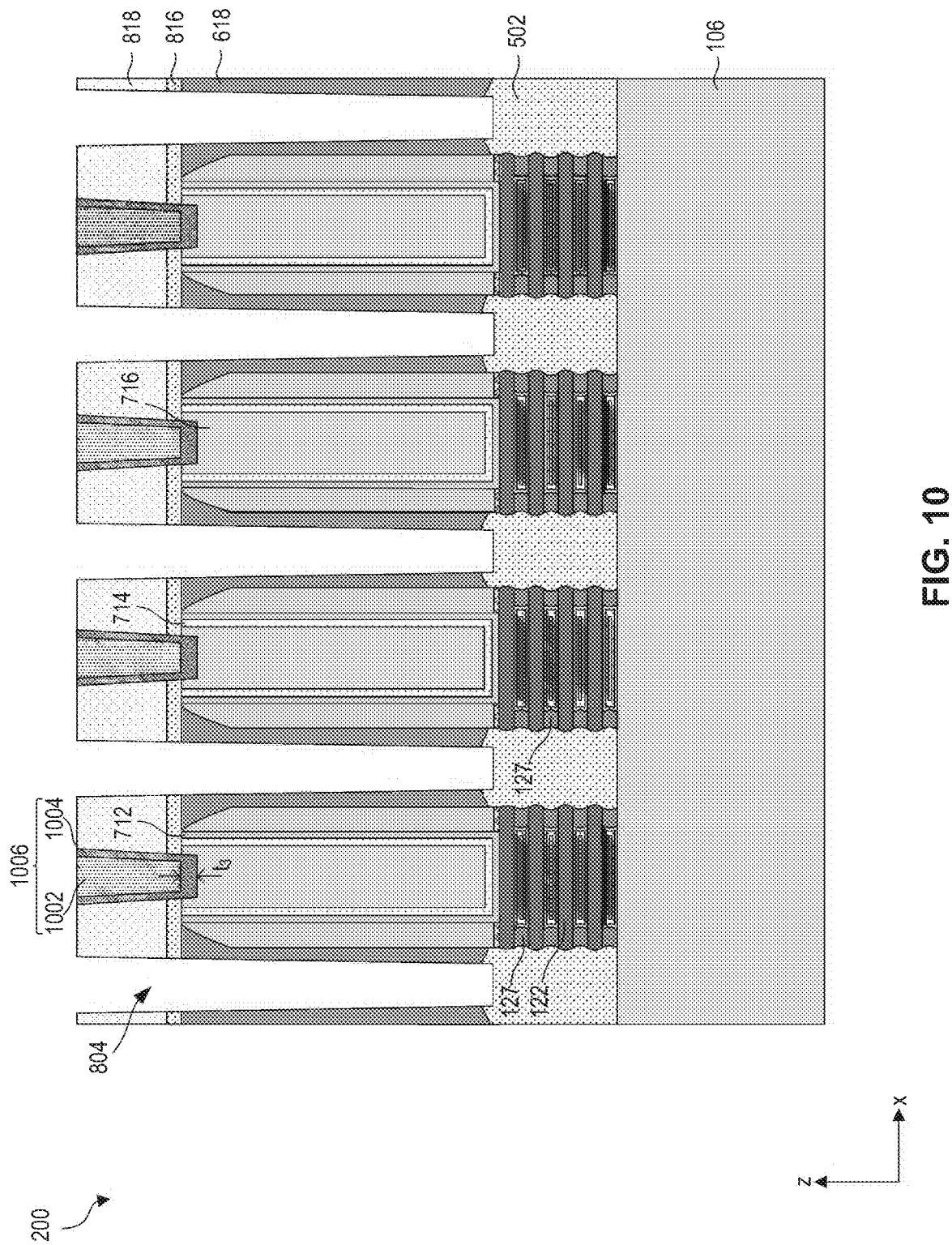

Referring to FIG. 1, in operation 145, fluorine-metal compounds and barrier layers are formed on the gate electrodes, according to some embodiments. Referring to FIG. 10, fluorine-metal compound 1002 and barrier layer 1004 are formed above gate electrodes 716 and between portions dielectric layers 816 and 818. In some embodiments, fluorine-metal compound 1002 and barrier layer 1004 extend into gate electrode 716. Gate contacts 1006 include fluorine-metal compound 1002 and barrier layer 1004.

Fluorine-metal compound 1002 can be formed by directly depositing a metal in opening 806 and on byproduct 820 (illustrated in FIG. 9 but not illustrated in FIG. 10). The metal deposition process can be a plasma-activated deposition method that activates byproduct 820 remaining in openings 806 so the deposited metal and byproduct 820 form a fluorine-metal compound. For example, the metal deposition process can be a plasma-activated deposition process for depositing titanium. In some embodiments, other suitable metal materials can be deposited. For example, a metal material such as tantalum, aluminum, copper, tungsten, or any suitable metal material can be deposited. In some embodiments, byproduct 820 can be formed using ammonium hydrogen fluoride and titanium can be deposited to form fluorine-metal compound 1002 containing ammonium hydrogen fluoride and titanium. In some embodiments, fluorine-metal compound 1002 can have a thickness $t_3$ between about 5 nm and about 25 nm, between about 7 nm and about 22 nm, between about 10 nm and about 20 nm, or any other suitable thicknesses. In some embodiments, thickness $t_3$ can be adjusted to provide a nominal contact resistance for gate contacts 1006. For example, a greater thickness $t_3$ can provide a greater contact resistance and a lower thickness $t_3$ can provide a lower contact resistance. In some embodiments, an optional barrier layer 1004 can be formed between fluorine-metal compound 1002 and dielectric layers 816 and 818. In some embodiments, barrier layer 1004 can be formed using a direct treatment process or a deposition process. In some embodiments, barrier layer 1004 can be formed using titanium nitride.

Figure 11:
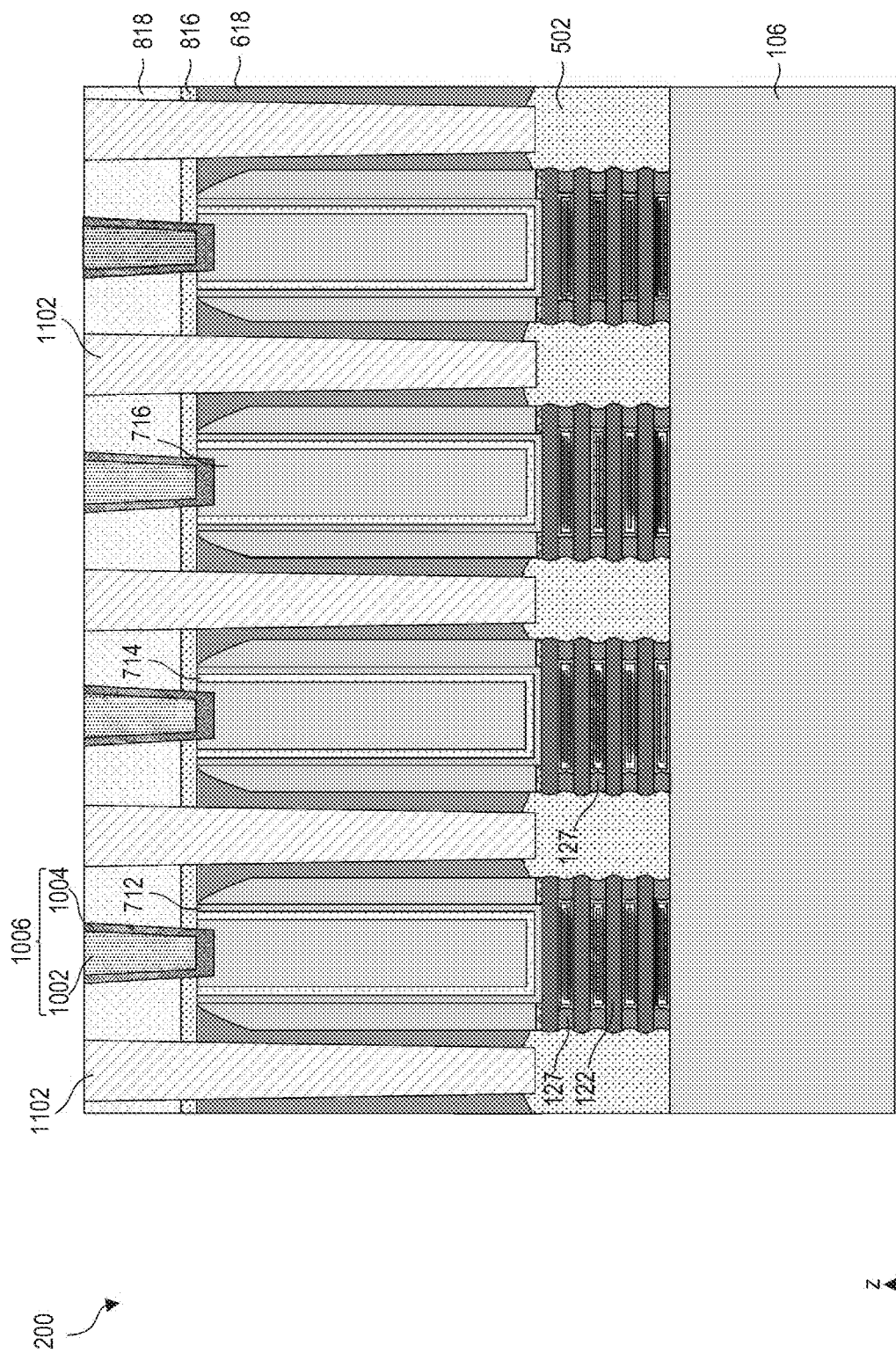

Referring to FIG. 1, in operation 150, source/drain contacts are formed on the source/drain regions, according to some embodiments. Referring to FIG. 11, source/drain contacts 1102 are formed in openings 804 and in contact with source/drain structures 502. Source/drain contacts 1102 and gate contacts 1006 are formed to provide electrical connections to the source/drain regions and the gate electrodes, respectively. Specifically, source/drain contacts 1102 and gate contacts 1006 can be used to transmit electrical signals between source/drain regions and gate electrodes and external terminals (not shown in FIG. 11). Source/drain contacts 1102 can be formed by depositing a conductive material in openings 804. The deposition process can include depositing a metal layer within openings 804 and performing an anneal process to induce silicidation of the deposited metal layer. The conductive materials for forming source/drain contacts 1102 can include cobalt. In some embodiments, source/drain contacts 1102 can be formed using titanium, aluminum, silver, tungsten, copper, ruthenium, zirconium, nickel, titanium nitride, tungsten nitride, metal alloys, and combinations thereof. The deposition process can include ALD, PVD, CVD, any suitable deposition process, and combinations thereof.

A planarization process can planarize the top surfaces of dielectric layer 818, source/drain contacts 1102, and gate contacts 1006 so the top surfaces are substantially coplanar. In some embodiments, source/drain contacts 1102 can extend into source/drain structures 502. Silicide regions (not shown in FIG. 11) can be formed between source/drain contacts 1102 and source/drain structures 502 to reduce contact resistance. In some embodiments, the silicide regions can include ruthenium silicide, nickel silicide, cobalt silicide, tungsten silicide, tantalum silicide, platinum silicide, erbium silicide, palladium silicide, any suitable silicide material, and combinations thereof.

Figure 12:
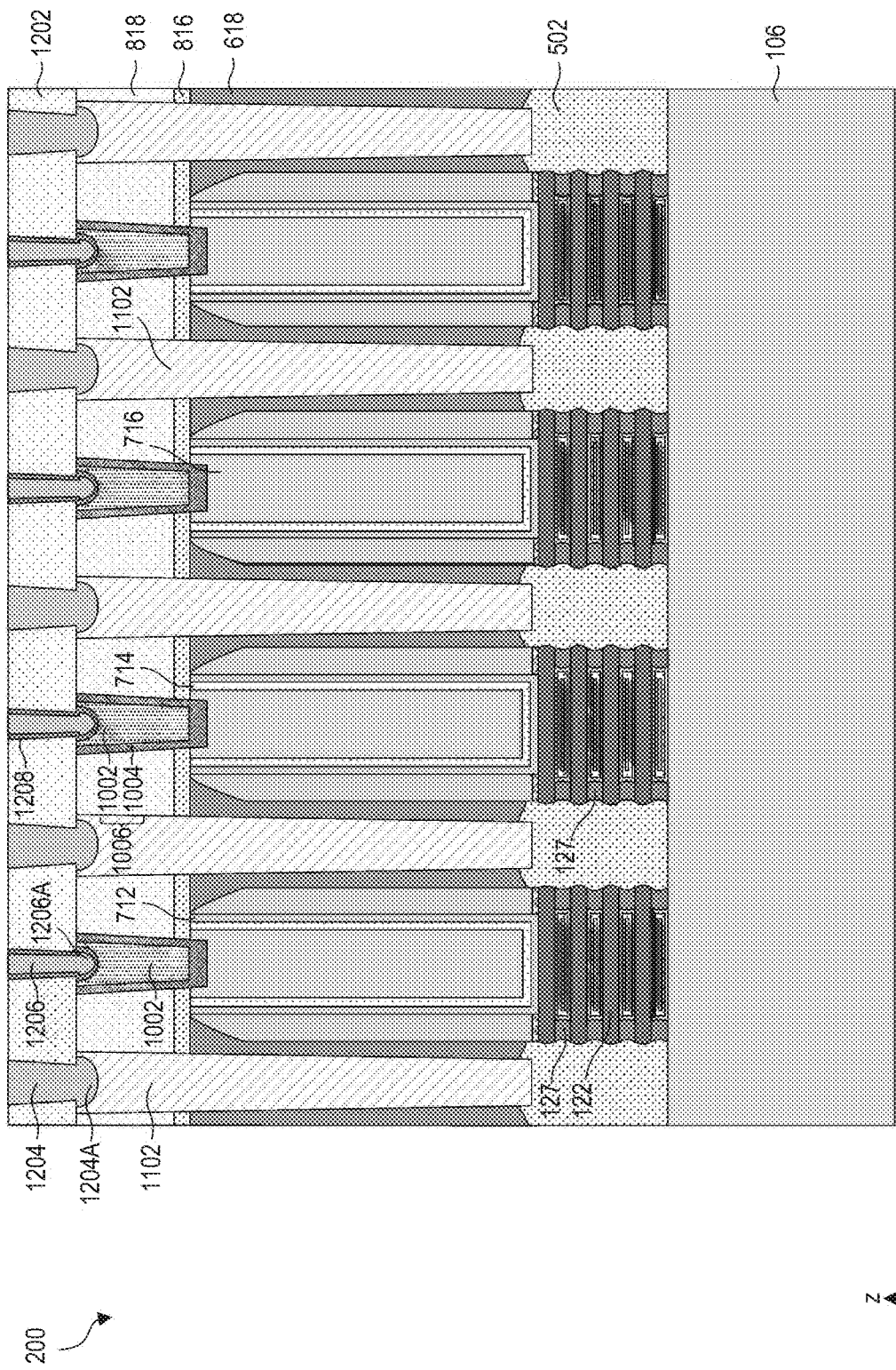

Referring to FIG. 1, in operation 155, dielectric layers are deposited and interconnect structures are formed in the dielectric layers, according to some embodiments. Referring to FIG. 12, dielectric layer 1202 is deposited on the top surface of dielectric layer 818, source/drain contacts 1102, and gate contacts 1006. Conductive interconnects, such as vias 1204 and 1206, are formed on source/drain contacts 1102 and gate contacts 1006, respectively. Dielectric layer 1202 can be an ILD layer and be formed using similar material as dielectric layers 816 and 818. For example, dielectric layer 1202 can be formed using a low-k dielectric material (e.g., a dielectric material having dielectric constant less than about 3.9).

Vias 1204 and 1206 can be conductive structures having semi-spherical or arcuate-shaped anchors 1204A and 1206A respectively embedded in the underlying source/drain contacts 1102 and gate contacts 1006. In some embodiments, the purpose of having anchors is twofold: (i) provide a larger contact area between vias 1204 and 1206 and the underlying source/drain contacts 1102 and gate contacts 1006, and (ii) prevent damage to the interconnects during a planarization process. For example, vias 1204 and 1206 can be "pulled-out" during a planarization process of the top surfaces of dielectric layer 1202 and vias 1204 and 1206.

Vias 1204 and 1206 can be formed by performing a patterning and etching process to form openings through dielectric layer 1202 to expose the underlying contact structures and performing one or more isotropic etching process to extend the openings in the underlying contact structures. For example, the isotropic etching processes can be wet chemical etching processes that have substantially similar etching rates in the vertical direction (e.g., z direction) and in the horizontal direction (e.g., x direction) so the extended openings extend under a bottom surface of dielectric layer 1202. For example, a width of anchor 1204A embedded in source/drain contact 1102 can be greater than a width of via 1204 formed in dielectric layer 1202. Similarly, a width of anchor 1206A embedded in gate contact 1006 can be greater than a width of via 1206 formed in dielectric layer 1202. FIG. 12 illustrates anchor 1206A of via 1206 embedded in fluorine-metal compound 1002 and separated from, or not in contact with, barrier layer 1004. Although not illustrated in FIG. 12, the isotropic etching processes may also etch barrier layer 1004 so anchor 1206A may extend into barrier layer 1004. Vias 1204 and 1206 can be formed using any suitable conductive material. For example, vias 1204 and 1206 can be formed using tungsten. In some embodiments, vias 1204 and 1206 can be formed using titanium, aluminum, silver, cobalt, copper, ruthenium, zirconium, nickel, titanium nitride, tungsten nitride, metal alloys, and combinations thereof.

Vias 1204 and 1206 can be formed in different steps and/or using different processes. For example, via 1204 can be formed prior to the formation of via 1206 using a selective growth method and via 1206 can be formed by depositing conductive material using a deposited adhesive or seed layer. In some embodiments, source/drain contacts 1102 are formed using cobalt and openings are formed both on source/drain contacts 1102 and gate contacts 1006. A tungsten material can be selectively grown on source/drain contacts 1102 using the cobalt material of source/drain contacts 1102 as a seed layer. The tungsten material may have minimal growth on the fluorine-metal compound material of gate contacts 1006. In some embodiments, an adhesive layer 1208 can be deposited on gate contact 1006 and sidewalls of dielectric layers 1202. Adhesive layer 1208 is used for facilitating tungsten growth so tungsten material is deposited over and electrically coupled to gate contacts 1006. In some embodiments, adhesive layer 1208 can also be a seed layer from which tungsten is grown. In some embodiments, adhesive layer 1208 can be formed of boron or silicon and deposited using a conformal film deposition process, such as ALD, CVD, PECVD, any suitable film deposition process, and combinations thereof.

Figure 13:
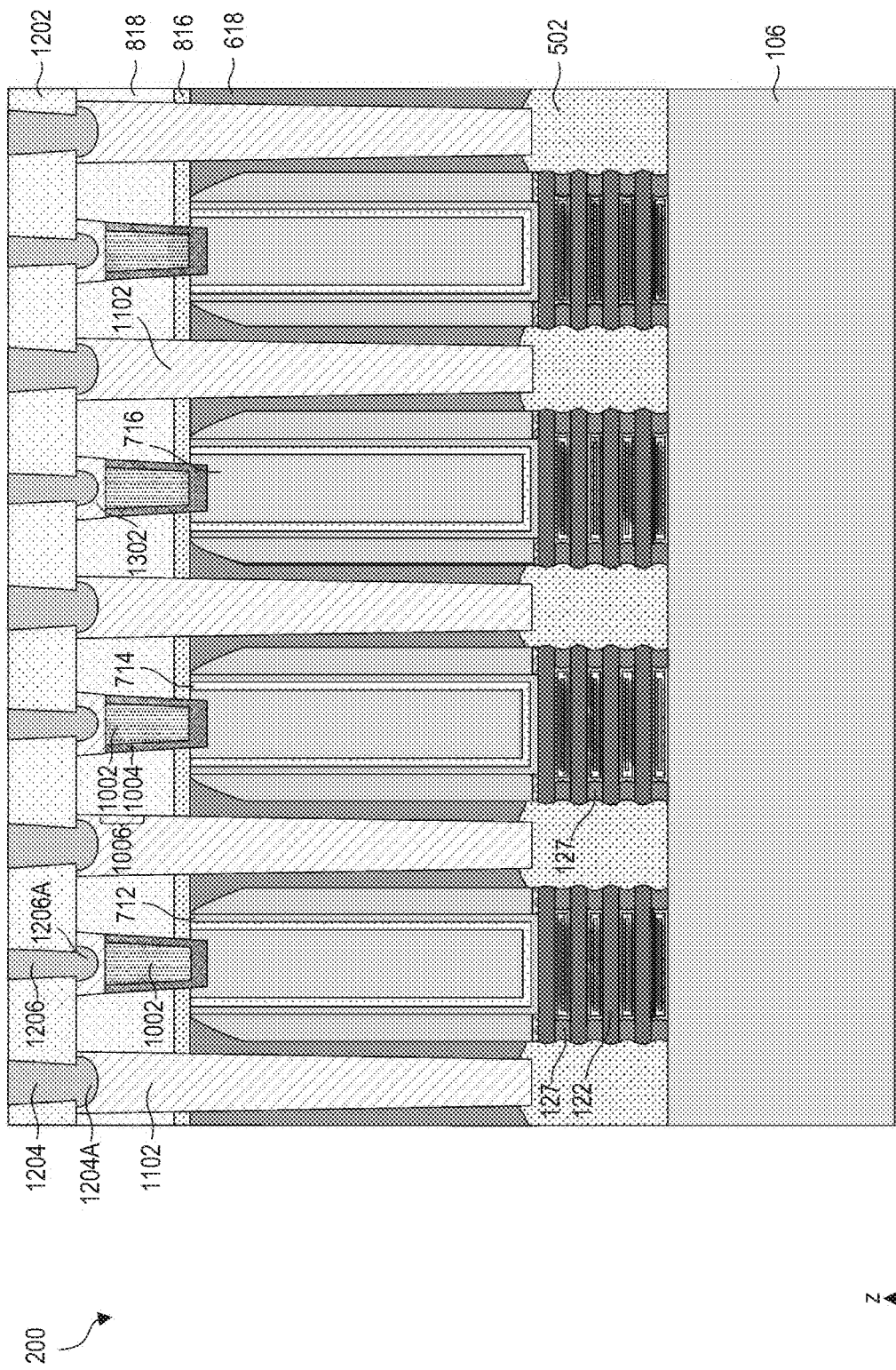

FIG. 12 illustrates via 1206 formed on adhesive layer 1208. Alternatively, a metal conductive layer can be deposited on gate contact 1006 and via 1206 can be formed using a selective growth method using the metal conductive layer as a seed layer. FIG. 13 illustrates via 1206 formed on conductive structure 1302 using a selective growth method. During the cobalt deposition process for forming source/drain contacts 1102, a portion of cobalt material can also be deposited on gate contact 1006 to form a conductive structure 1302. The formation of vias 1204 and 1206 can be conducted simultaneously by selectively growing tungsten using source/drain contacts 1102 and conductive structure 1302 as seed layers.

Back-end-of-line (BEOL) interconnect structures (not illustrated in FIGS. 12 and 13) can be formed on dielectric layer 1202, interconnects 1204 and 1206, and other suitable structures. In some embodiments, the BEOL interconnects can be a network of electrical connections that include vias extending vertically (e.g., along the z-axis) and wires extending laterally (e.g., along the x-axis). Interconnect structures can provide electrical connections to interconnects 1204 and 1206. In some embodiments, suitable passive and active semiconductor devices can be formed in dielectric layers 816, 818, and 1202 and are not illustrated for simplicity.

Various embodiments in the present disclosure describe methods for forming gate contact structures having nominal resistances. Specifically, a cleaning process performed on the gate structures can dispose fluorine-containing material, such as ammonium hydrogen fluoride ($NH_4F.HF$), on top surfaces of the gate electrode. One or more treatment processes can remove portions of the fluorine-containing material so a nominal amount of fluorine-containing material remains on the top surface of the gate electrode. Metal material, such as titanium, is subsequently deposited on the top surface of the gate electrode and reacts with the fluorine-containing material to form a fluorine-containing metal compound. A conductive via, such as tungsten, can be deposited on the fluorine-containing metal compound to form the bulk of the gate contact structure. In some embodiments, the amount of fluorine-containing metal compound formed between the gate electrode and the conductive via can be determined by the amount of fluorine-containing material after the treatment process and the amount of subsequently-deposited metal material. A greater amount of fluorine-containing metal compound can provide a gate contact structure having a greater resistance. The gate contact structure described in the present application provide various benefits, such as adjustable gate contact resistance by varying the treatment and deposition processing conditions. The gate contact resistance can be increased or decreased to match the impedance of subsequently-formed external circuitry, which in turn improves device performance and reliability.

In some embodiments, a method for forming a semiconductor device includes forming a source/drain structure and forming a gate structure. The method also includes performing a cleaning process on the source/drain structure and the gate structure. The method also includes disposing a portion of a byproduct of the cleaning process on a top surface of the gate structure and etching the portion of the byproduct so a remaining portion of the byproduct is formed on the top surface of the gate structure. The method further includes forming a gate contact structure, including depositing a metal material on the remaining portion of the byproduct to form a compound containing the metal material and the remaining portion of the byproduct. The method also includes forming a barrier layer between the compound and the top surface of the gate structure.

In some embodiments, a method includes forming nanostructures on a substrate and forming a source/drain structure in contact with the nanostructures. The method also includes forming a gate structure on the nanostructures and performing a cleaning process on the source/drain structure and the gate structure. The method also includes disposing a first portion of a byproduct of the cleaning process on a top surface of the source/drain structure and a second portion of the byproduct on a top surface of the gate structure. The method also includes removing the first portion of the byproduct from the top surface of the source/drain structure and etching the second portion of the byproduct so a remaining second portion of the byproduct is formed on the top surface of the gate structure. The method further includes depositing a metal material on the remaining second portion of the byproduct to form a compound, the compound including the metal material and the remaining second portion of the byproduct. The method further includes forming a barrier layer between the compound and the top surface of the gate structure.

In some embodiments, a semiconductor structure includes a gate structure on nanostructures and a gate contact structure on the gate structure. The gate contact structure includes a barrier layer and a fluorine-metal compound formed on the barrier layer. The semiconductor structure also includes an interconnect formed on and electrically coupled to the fluorine-metal compound.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a source/drain structure;
    forming a gate structure;
    performing a cleaning process on the source/drain structure and the gate structure, comprising disposing a portion of a byproduct of the cleaning process on a top surface of the gate structure;
    etching the portion of the byproduct so a remaining portion of the byproduct is formed on the top surface of the gate structure; and
    forming a gate contact structure, comprising:
        depositing a metal material on the remaining portion of the byproduct to form a compound comprising the metal material and the remaining portion of the byproduct; and
        forming a barrier layer between the compound and the top surface of the gate structure.

2. The method of claim 1, wherein performing the cleaning process further comprises disposing an other portion of the byproduct on a top surface of the source/drain structure.

3. The method of claim 2, further comprising removing the other portion of the byproduct from the top surface of the source/drain structure.

4. The method of claim 1, wherein disposing the portion of the byproduct comprises disposing ammonium hydrogen fluoride.

5. The method of claim 1, wherein depositing the metal material comprises depositing titanium.

6. The method of claim 1, wherein forming the barrier layer comprises forming titanium nitride.

7. The method of claim 1, wherein etching the portion of the byproduct comprises performing a multi-cycle degas process.

8. The method of claim 7, wherein performing the multi-cycle degas process comprises performing an argon plasma etching process.

9. The method of claim 7, wherein performing the multi-cycle degas process comprises performing the multi-cycle degas process at a temperature between about 380° C. and about 420° C.

10. The method of claim 7, wherein performing the multi-cycle degas process comprises performing the multi-cycle degas process for a time between about 60 s and about 80 s.

11. A method, comprising:
    forming a plurality of nanostructures on a substrate;
    forming a source/drain structure in contact with the plurality of nanostructures;
    forming a gate structure on the plurality of nanostructures;
    performing a cleaning process on the source/drain structure and the gate structure, comprising disposing a first portion of a byproduct of the cleaning process on a top surface of the source/drain structure and a second portion of the byproduct on a top surface of the gate structure;
    removing the first portion of the byproduct from the top surface of the source/drain structure;
    etching the second portion of the byproduct so a remaining second portion of the byproduct is formed on the top surface of the gate structure;
    depositing a metal material on the remaining second portion of the byproduct to form a compound comprising the metal material and the remaining second portion of the byproduct; and
    forming a barrier layer between the compound and the top surface of the gate structure.

12. The method of claim 11, wherein performing the cleaning process comprising removing one or more oxide materials from the top surface of the source/drain structure and the top surface of the gate structure.

13. The method of claim 11, wherein disposing the first and second portions of the byproduct comprises disposing ammonium hydrogen fluoride.

14. The method of claim 11, wherein forming the barrier layer comprises forming titanium nitride.

15. The method of claim 11, wherein etching the second portion of the byproduct comprises performing a multi-cycle degas process, and wherein each cycle of the multi-cycle degas process comprises an argon plasma etching process.

16. A method, comprising:
    forming a gate structure on a plurality of nanostructures;
    depositing a gate contact structure on the gate structure, comprising:
        etching an opening in the gate structure;
        performing a cleaning process within the opening to deposit a fluorine-containing compound within the opening; and
        depositing a metal layer on the fluorine-containing compound to form a metal contact.

17. The method of claim 16, further comprising etching a portion of the fluorine-containing compound prior to forming the metal contact.

18. The method of claim 16, wherein forming the metal contact comprises depositing a metal layer using a plasma activated deposition method.

19. The method of claim 17, wherein etching the portion of the fluorine-containing compound comprises performing a degas process at a temperature between about 300° C. and about 500° C.

20. The method of claim 19, wherein performing the degas process comprises performing multiple cycles of plasma-etching processes, wherein each cycle of the multiple cycles is performed for a predetermined amount of time.

* * * * *